United States Patent
Arnz et al.

(10) Patent No.: US 7,755,748 B2
(45) Date of Patent: Jul. 13, 2010

(54) DEVICE AND METHOD FOR RANGE-RESOLVED DETERMINATION OF SCATTERED LIGHT, AND AN ILLUMINATION MASK

(75) Inventors: Michael Arnz, Oberkochen (DE); Oswald Gromer, Heidenheim (DE); Gerd Klose, Oberkochen (DE); Joachim Stuehler, Aalen (DE); Matthias Manger, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/181,774

(22) Filed: Jul. 29, 2008

(65) Prior Publication Data

US 2008/0285018 A1 Nov. 20, 2008

Related U.S. Application Data

(63) Continuation of application No. 10/960,082, filed on Oct. 8, 2004, now Pat. No. 7,408,631, which is a continuation-in-part of application No. PCT/EP03/10604, filed on Sep. 24, 2003.

(30) Foreign Application Priority Data

Aug. 4, 2003 (DE) ................. 103 36 299

(51) Int. Cl.
*G01B 9/00* (2006.01)
(52) U.S. Cl. ...................................... 356/124; 356/126
(58) Field of Classification Search ......... 356/124–126, 356/121, 401, 237.1–237.6, 238.1–238.3, 356/239.1–239.3; 430/30; 355/67; 250/548
See application file for complete search history.

(56) References Cited

U.S. PATENT DOCUMENTS

| 4,563,062 | A | | 1/1986 | Kanatani |
| 5,477,057 | A | * | 12/1995 | Angeley et al. ............. 250/548 |
| 6,312,373 | B1 | | 11/2001 | Ichihara |
| 6,556,286 | B1 | * | 4/2003 | La Fontaine et al. ........ 356/124 |
| 7,190,443 | B2 | | 3/2007 | Shiode |

(Continued)

FOREIGN PATENT DOCUMENTS

EP 1 308 991 A1 5/2003

(Continued)

OTHER PUBLICATIONS

Joseph P. Kirk, Scattered light in photolithographic lenses, SPIE, Mar. 2, 1994, pp. 566-572, vol. 2197, Bellingham, US.

(Continued)

*Primary Examiner*—Gregory J Toatley, Jr.
*Assistant Examiner*—Tri T Ton
(74) *Attorney, Agent, or Firm*—Sughrue Mion, PLLC

(57) ABSTRACT

A scattered light measurement device includes an illumination mask providing measuring radiation on an entrance side (1a) of a test component (1) and a detection part (3-6) for detection of light scattered by the test component and disposed on an exit side (1b) of the test component. The illumination mask includes at least one scattered light measurement structure, wherein the scattered light measurement structure has a scattered light marker zone and wherein the scattered light marker zone has a rotationally non-symmetric shape.

26 Claims, 7 Drawing Sheets

U.S. PATENT DOCUMENTS

| | | |
|---|---|---|
| 2002/0001088 A1 | 1/2002 | Wegmann et al. |
| 2002/0041377 A1* | 4/2002 | Hagiwara et al. ........... 356/399 |
| 2002/0176092 A1 | 11/2002 | Deck |
| 2003/0068565 A1 | 4/2003 | Ki et al. |
| 2004/0023130 A1 | 2/2004 | Yao et al. |
| 2004/0105085 A1 | 6/2004 | Suzuki |

FOREIGN PATENT DOCUMENTS

| | | |
|---|---|---|
| EP | 1 387 219 A2 | 2/2004 |
| JP | 2001-272766 | 10/2001 |
| WO | 01/63233 A2 | 8/2001 |
| WO | 2004/013695 A1 | 2/2004 |
| WO | 2004/107047 A1 | 12/2004 |

OTHER PUBLICATIONS

Eugene L. Church, Fractal surface finish, Applied Optics, Apr. 15, 1998, pp. 1518-1526, vol. 27, No. 8.

* cited by examiner

DEVICE AND METHOD FOR RANGE-RESOLVED DETERMINATION OF SCATTERED LIGHT, AND AN ILLUMINATION MASK

This is a Continuation of U.S. application Ser. No. 10/960,082, filed Oct. 8, 2004, which is a Continuation in-Part of International Application PCT/EP03/10604, with an international filing date of Sep. 24, 2003, which was published under PCT Article 21(2) in English, and which claims priority of German Patent Application No. 103 36 299.1 filed on Aug. 4, 2003. The entire disclosures of the prior applications are hereby incorporated into this application by reference.

BACKGROUND OF THE INVENTION

1. Field of the Invention

The invention relates to an illumination mask for a device for the range-resolved determination of scattered light, having one or more scattered-light measuring structures, which respectively include an inner dark-field zone which defines a minimum scattering range, to a corresponding device which comprises the illumination mask for the provision of measuring radiation on an entry side of a specimen and a detection part for the range-resolved detection of scattered light on an exit side of the specimen, to an image-field mask which can be used for this, to an associated operating method and to a microlithography projection-exposure system having such a device.

2. Description of the Related Art

Such devices and methods are used, for example, for the purpose of drawing from the scattered light of optical components detected in a range-resolved fashion conclusions about their optical properties and optical quality, for example with regard to surface roughnesses, contaminations and material inhomogeneities. Moreover, a scattered-light portion thus determined can correctively be considered if a spatially resolved knowledge, which is as accurate as possible, of the quantity of radiation actually supplied by an optical system is desired in corresponding optical applications, such as lithographic exposure apparatuses, for example. In the text which follows, the term light is used for the sake of simplicity to denote electromagnetic radiation of arbitrary wavelength, in particular radiation in the UV or EUV range.

For the purpose of range-resolved determination of scattered light, in a conventional method a non-transparent object which acts as dark-field zone is introduced into the beam path of a directed illuminating radiation having a larger beam cross section compared to the object, such that a shadow image of the object is produced. If the system to be examined, presently also termed a test component, is an imaging optical system, the non-transparent object is positioned in the object plane of the system. The object is imaged by the imaging system onto an image of the object in the image plane which may be enlarged or reduced by the reproduction scale and which is denoted as an "aerial image" below, as is also denoted the pure shadow image in the case of test components which are not focusing imaging systems.

Scattering of the illuminating light by the test component has the effect that scattered light passes laterally into the dark zone of the surface of the aerial image. The intensity of this scattered light normally decreases with increasing distance from the edge to the middle of the aerial image. Depending on the lateral distance from the edge of the aerial image, denoted below as scattering distance or scattering range, an intensity distribution of the scattered light thus arises which is determined as a function of distance, that is to say range-resolved.

In a conventional mode of procedure, a sensor surface is introduced as a component of a detection part into the plane in which the aerial image is produced or detected. For the sake of simplicity, the term image plane is also used for this plane whenever the test component is not a focusing imaging system. It is important here that the sensor surface is smaller than the aerial image so that a minimum, lateral scattering distance remains between the edge of the sensor surface and the edge of the aerial image. In consecutive measuring operations, objects of different size are then positioned such that the size of the aerial image, and thus the minimum scattering distance, changes. It is known for this purpose to provide objects of variable size at a distance from one another on an otherwise transparent illumination mask. Chromium squares of variable edge length, for example, are used as objects. The sensor surface correspondingly has a quadratic geometry. In order to vary the minimum scattering distance, the illumination mask is displaced such that the objects applied to it are brought one after the other into the beam path and imaged onto the sensor surface centred on the image side in the plane of the aerial image.

In one of the conventional measuring methods, the entire intensity of the scattered light impinging on the sensor surface over a fixed time interval is determined integrally for each object size, for example with the aid of an electro-optical measuring element. Each object size is assigned a minimum scattering distance in the image plane, the maximum scattering distance being infinity in theory for all objects. The scattered light distribution can be reconstructed from the intensity distribution as a function of the minimum scattering distance.

Instead of directly measuring the intensity of the scattered light on the sensor surface, in the case of an alternative conventional measuring method a photo-resist layer is provided in the image plane as sensor surface, and in different measuring operations a respectively different region of the photo-resist layer is irradiated with illuminating radiation of increasing intensity. Then, that limiting value for the intensity is determined in the case of which the aerial image first vanishes entirely as a structure in the photo-resist layer. This limiting value for the intensity of the illuminating light is used instead of the light intensity integrated over the sensor surface in order to determine the scattered light distribution. These and further details relating to conventional methods of determining scattered light are to be found in the relevant literature, see, for example, the magazine article by J. P. Kirk, "Scattered Light in Photolithographic Lenses", SPIE, Volume 2197 (1994), pages 566-572, and the magazine article by Eugene L. Church, "Fractal Surface Finish", Applied Optics, Volume 27, No. 8 (1988), pages 1518-1526.

In the case of the conventional methods outlined above, effects with a long scattering range are normally superimposed on effects of short to medium scattering ranges. The non-transparent objects on the illumination mask certainly define a minimum scattering range, but the maximum scattering range is limited only by the size of the object field, that is to say the illumination mask. Moreover, since the squares have a relatively large spacing from one another, in order not to disturb one another during the measurements, and are typically arranged in a nonsymmetrical distribution, the long-range scattering light intensity is a function of the field point, and so systematic measuring errors can occur.

The devices and methods currently of interest for determining scattered light are chiefly used in the field of medium scattering ranges, what corresponds, e.g., to typical object-side scattering ranges in a region from approximately 4 μm to approximately 1000 μm and/or image-side scattering ranges from approximately 1 μm to approximately 250 μm.

Especially for the characterization of optical systems, and in particular optical imaging systems, not only the scattered-light behavior thereof but also the behavior thereof with respect to imaging defects are of interest. Various wavefront-measurement devices and methods have been proposed for this, which can be used to find the effect of the specimen on the wavefront behavior, for example by an interferometric or Moiré fringe technique, from which the imaging defect behavior can be deduced. An important field of application is the wavefront measurement of optical systems for microlithography, in particular projection objectives for microlithography projection-exposure systems for the patterning of semiconductor wafers.

Imaging defects of such high-resolution imaging objectives can be determined with the required accuracy by using the wavefront-measurement technique, in which case radiation of the same wavelength as in the useful imaging operation of the objective is preferably used for the measurement, and it has recently become more common to use UV radiation in the wavelength range shorter than about 200 nm. Interferometric measurement devices which work in this way with measuring radiation at the operating wavelength of the specimen may also be referred to as operational interferometers (OIF) for this reason and they may, for example, be integrated into the projection-exposure system in question. Various types of interferometric wavefront-measurement devices are currently used for this purpose, such as those which are based on shear interferometry or point diffraction interferometry, or those of the Ronchi type, Twyman-Green type or Shack-Hartmann type.

As an alternative to single-channel measurement devices, it is also possible to use multi-channel measurement devices with which measurements can be taken from a plurality of field points in parallel, i.e. simultaneously, so that shorter measuring times for full-field measurements can be achieved compared with single-channel devices. For example, the laid-open patent specification WO 01/63233 A2 (corresponding to US 2002/0001088) discloses a multi-channel measurement device which works with lateral shear interferometry. Such a device typically includes an illumination mask, which is to be arranged on the object side of the specimen and has a structure for generating wavefronts separately for the various field points, and a diffraction-grating structure to be arranged on the image side of the specimen for the various field points. With a suitable design of the system, the interferograms for the individual field points can be kept substantially separate and can be discriminately recorded by a downstream detector, with a detector surface thereof preferably being placed at a very short distance from the diffraction-grating structure.

SUMMARY OF THE INVENTION

It is one object of the invention to provide an illumination mask and an image-field mask for a device for the range-resolved determination of scattered light, as well as such a device and an associated operating method, which permit determination of scattered light with a high range resolution and with a good signal-to-noise ratio, and optionally wavefront measurement. It is also an object of the invention to provide a microlithography projection-exposure system equipped with such a device.

These objects are addressed by providing an illumination mask, an image-field mask, a device, a method, and a microlithography projection-exposure system as claimed herein.

The illumination mask according to the invention has one or more scattered-light measuring structures in which a scattered-light marker zone in the form of a bright-field zone borders an inner and an outer dark-field zone. By contrast with the above-described conventional illumination mask, the result of this is to fix not only a minimum, but also a maximum scattering range. This reduces the long-range scattered-light component, and this can contribute to a significant improvement in the signal-to-noise ratio and to the avoidance of systematic measuring errors. The geometry of the scattered-light marker zone can be adapted in this case to the geometry of the scattered-light effects to be measured or of the test component.

In one embodiment, the illumination mask has a plurality of scattered-light marker zones with inner and/or outer dark-field zones of different sizes. It is thereby possible to vary the minimum and/or the maximum scattering range.

In a refinement of the invention, the scattered-light marker zone is designed as a ring, something which is advantageous, in particular, when the scattered-light effects to be measured have a rotationally symmetrical structure. This is the case, for example, whenever the test component likewise has a substantially rotationally symmetrical structure, as is the case with many optical components.

In a development of the invention, the illumination mask has a plurality of scattered-light marker zones designed as rings and having different ring radii. As a result, the inner and the outer dark-field zones, and thus the minimum and maximum scattering range, vary from ring to ring, and this can be used advantageously in determining the scattered light in a range-resolved fashion. Since the scattered light generally decreases exponentially with increasing scattering range, it can be favourable to enlarge the ring width suitably with increasing ring radii, in order thereby to compensate for the decrease in the measured scattered-light intensity at least partially.

In order to achieve an improvement in the signal-to-noise ratio, the scattered-light marker zones designed as rings can be selected with their radii overlapping. Alternatively, the ring radii are selected not to be overlapping, and this increases the range separation when determining the scattered light.

The illumination mask may advantageously be designed as a dark-field mask with the scattered-light marker zone or zones as bright-field zones in the mask dark field. It proves to be favourable in this case that in essence only the part of the illumination mask left free from the scattered-light marker zones is of transparent design such that, in particular, no long-range scattered light is caused by large transparent surface regions.

In a development of the invention, the scattered-light measuring structures and one or more dark-field area elements are arranged in the form of a matrix in a regular distribution on the illumination mask such that all the nearest neighbours of the dark-field area elements are scattered-light measuring structures. The dark-field area elements can be used, for example, for calibration purposes. Since all the nearest neighbours of the dark-field area elements are scattered-light measuring structures, the influence exerted by the surrounding scattered-light measuring structures on the aerial image of a dark-field area element virtually does not differ from dark-field area element to dark-field area element.

According to a preferred refinement of the invention, a plurality of scattered-light measuring structures are arranged distributed over the illumination mask and wavefront-measurement structures, which are suitable for wavefront measurement of an optical system, are provided in intermediate spaces between the scattered-light measuring structures.

In this way, the illumination mask can be used for combined determination of scattered light and wavefront measurement of an optical system. In another configuration, the scattered-light measuring structures are arranged in matrix form and the wavefront-measurement structures are arranged in matrix form in intersection areas of the scattered-light measurement-structure matrix.

The image-field mask according to the invention has a plurality of individual diaphragm structures, of which at least two diaphragm structures have diaphragm openings of different size and/or different shape. The image-field mask therefore provides different diaphragm openings with which range-resolved measuring of scattered light is possible for a respective field point in successive measuring processes. For each measuring process, owing to the plurality of available diaphragm structures which are arranged separately on the image-field mask, measurements can advantageously be taken simultaneously at a plurality of field points, and in the extreme case at all of the relevant field points.

In a preferred refinement of the invention, the diaphragm structures have circular diaphragm openings with two or more different diameters.

In a preferred refinement of the invention, the diaphragm structures are arranged separated on the image-field mask, for example in matrix form, and wavefront-measurement structures for interferometric wavefront measurement of an optical system are provided in intermediate spaces between the diaphragm structures. This makes it possible to utilize the image-field mask both for the determination of scattered light and for the multi-channel wavefront measurement of an optical system.

The device according to the invention for the range-resolved measuring of scattered light on a specimen has an illumination mask according to the invention. In particular, the proportion of long-range scattered light can therefore be reduced in such a device, which may have an advantageous effect on the quality of the measurement.

In a development of the invention, the device is designed for measurement on an optical imaging system, the illumination mask being arranged in or near the object plane. The detection part has a field stop to be arranged in or near the image plane, a micro-objective and a sensor surface for scattered-light measurement. The field stop opening is imaged onto the sensor surface by the micro-objective. The field stop screens off any disturbing, external scattered light which does not originate from the scattered-light measuring structure which is imaged onto the image plane by the optical imaging system. The sensor surface can be positioned outside the image plane by using the micro-objective. The scattered-light information obtained by the sensor surface can be used by the associated evaluation part to determine in a range-resolved fashion the scattered light caused by the test component.

In another configuration, the device according to the invention is designed for the multi-channel measuring of scattered light, and to that end, in addition to the illumination mask according to the invention, it also has a corresponding image-field mask, i.e. the diaphragm structures thereof correspond with scattered-light measuring structures of the illumination mask. This permits parallelized processes of measuring scattered light simultaneously for a plurality of field points.

In a preferred configuration of the invention, the device is also configured for multi-channel wavefront measurement of the optical imaging system, i.e. this device can be used to determine both the scattered-light behavior and the imaging defect behavior of the optical system. To that end, the device has an illumination mask according to the invention with wavefront-measurement illumination-mask structures, and an image-field mask according to the invention with wavefront-measurement image-field mask structures, which correspond with the wavefront-measurement illumination-mask structures in order to carry out a wavefront measurement. This provides a device which can be used to both for a multi-channel determination of scattered light and for a multi-channel wavefront measurement of optical systems, in which case for each measuring process, measurements can advantageously be taken simultaneously at a plurality of field points, and in the extreme case at all of the relevant field points. This permits a full-field measurement of optical systems with respect to scattered-light behavior and imaging defect behavior with relatively short measuring times.

In a preferred refinement of the device according to the invention, the detection part includes at least one immersion-medium space, for example in the optical path before and/or after the image-field mask or field diaphragm, into which an immersion medium can be introduced.

In a development of the inventive device, the sensor surface is implemented in a first variant as an electro-optical sensor. In a second variant, the sensor surface is designed as a radiation-sensitive layer which upon irradiation is changed from a first state to a second state. In the latter case, the detection part has suitable means for measuring the state of the radiation-sensitive layer. In this second variant, the intensity or dose of the illuminating light can be increased for the purpose of range-dependent determination of scattered light until the aerial image vanishes as a structure in the radiation-sensitive layer. The corresponding intensity or dose of the illumination and/or the structural dimensions of the regions exposed by scattered light with different intensities of illumination are then a measure of the scattered light caused by the test component at each respective scattering distance.

In an operating method according to the invention, the electro-optical sensor surface is divided into subregions, for example into annular regions. When using a CCD array, this can be achieved by virtue of the fact that a multiplicity of CCD pixels are respectively combined to form corresponding subregions, and the intensity of the radiation falling onto the pixels of the respective subregion in a fixed time period is determined. The range resolution can be improved by evaluating subregions of the sensor surface, since several subregions of different scattering distance can be evaluated separately on the image side for each individual scattered-light measuring structure provided on the object side.

In another operating method according to the invention, the same scattered-light measuring structure is imaged onto different regions of the photosensitive layer in various measuring operations with a successive increase in intensity of the measuring radiation, and the range-resolved determination of scattered light is performed using state data for these regions of the photosensitive layer and/or using data for the intensity or dose of the measuring radiation. Depending on what is needed, it is possible thereby to make use only of the radiation dose that is required to cause the image of the scattered-light measuring structure on the photosensitive layer to vanish, or only of the layer state data for these regions, or of both parameters in combination for the range-resolved determination of scattered light.

Another preferred aspect of the invention relates to an operating method with which, by employing a device according to the invention configured appropriately for this, an optical channel system can be studied in multiple channels with respect to both scattered-light behavior and imaging defect behavior. In this way, both a range-resolved determination of scattered light and a wavefront measurement for the determination of imaging defects can be carried out on a specimen with a relatively short measuring time.

As an important field of application, the invention relates to a microlithography projection-exposure system having a device according to the invention for the range-resolved determination of scattered light on a projection objective of the projection-exposure system, and optionally for the wave-front measurement thereof as well. The projection objective does not necessarily need to be removed from the projection-exposure system for this. Optionally, with the device then being configured suitably for this, the measuring of scattered light and/or the wavefront measurement may be carried out in multiple channels for the full field of the objective.

BRIEF DESCRIPTION OF THE DRAWINGS

Advantageous exemplary embodiments of the invention are illustrated in the drawings and will be described below. In the drawings.

DETAILED DESCRIPTION OF PREFERRED EMBODIMENTS

Figure 1:
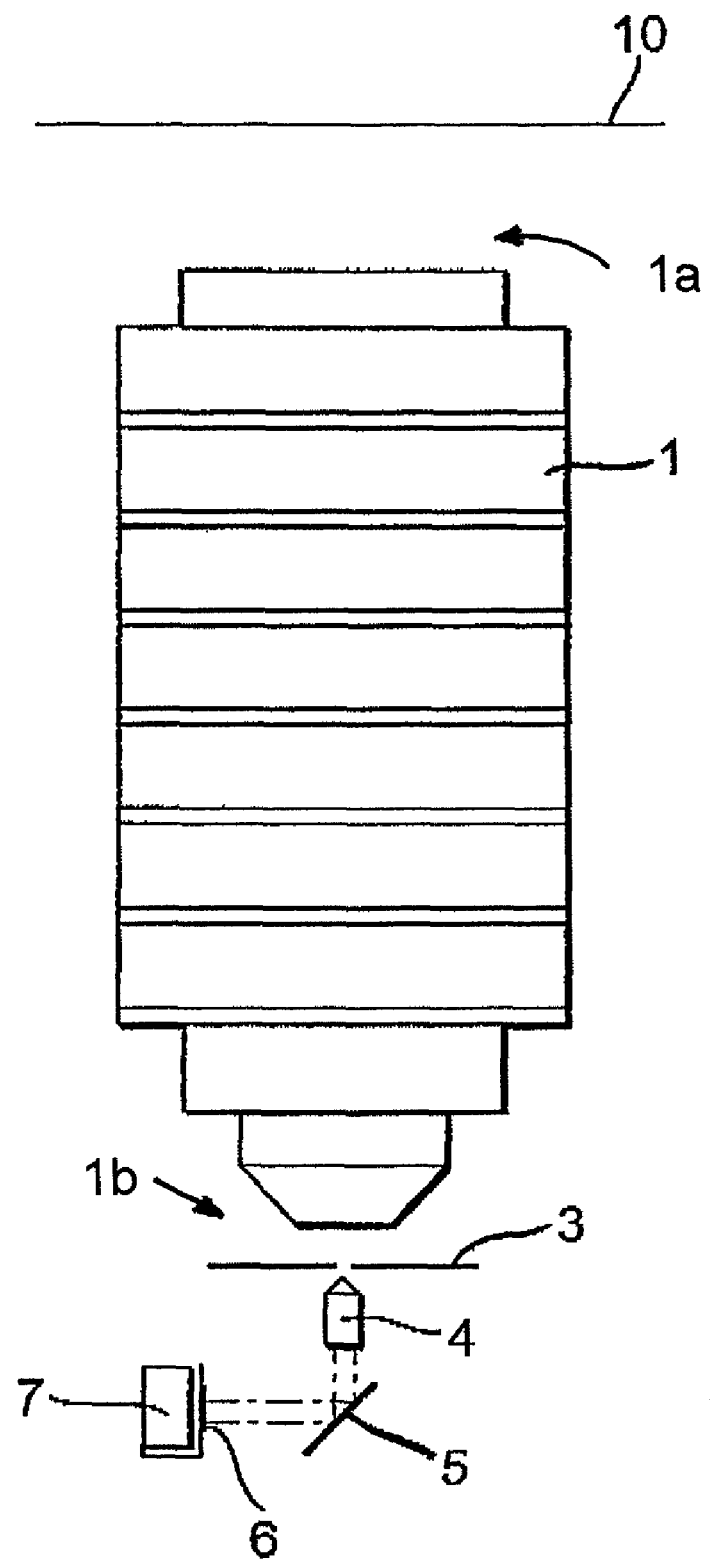
FIG. 1 shows a schematic side view of a device for range-resolved measurement of scattered light at a projection objective of a micro-lithographic projection exposure apparatus.

FIG. 1 shows a schematic side view of a device for range-resolved measurement of scattered light in operating position at a test component, which in this embodiment is a projection objective 1, for example of a micro-lithographic projection exposure apparatus for semiconductor wafer patterning. The device includes an illumination mask 10 positioned in the object plane on an entrance side 1a of the objective 1, a detection part which has a circular field stop 3 positioned in the image plane on the exit side 1b of the objective 1, a micro-objective 4 and a CCD array 6 as sensor surface, and an evaluation part 7. The micro-objective 4 images the field stop opening onto the CCD array 6 via a deflecting mirror 5. The illuminating light is provided by a conventional illuminating system (not shown).

The illumination mask 10 to be positioned in the object plane of the objective 1, for example by means of a conventional reticle holder, has one or more scattered-light measuring structures which in each case include a scattered-light marker zone in the form of an annular bright-field zone between an inner and an outer dark-field zone. In the measurement mode, a respective one of the scattered-light measuring structures is positioned in the object plane such that the imaging of the scattered-light measuring structure with the aid of the objective 1 in the image plane thereof produces an associated aerial image centred in the interior of the circular field stop 3.

Here, the object-side focal plane of the micro-objective 4 corresponds to the field stop plane. In order to avoid beam vignetting at a high numerical aperture of the objective 1, that is to say for numerical apertures greater than approximately 0.7, the field stop 3 is very thin, that is to say it has a thickness of less than 0.5 µm, preferably of only approximately 0.2 µm. On the one hand, the image of the stop edge is completely visible on the CCD array 6, and so detection is possible up to a distance of approximately 0.5 µm from the stop edge for image-side numerical apertures of the objective 1 as far as at least 0.95 in a fashion virtually free from vignetting using air as the image-space medium. Freedom from vignetting is also obtained in applications in which any appropriate immersion medium, for example water, is provided as an image-space medium in the detector part. In this case, for immersion systems with a numerical aperture NA>1, the maximum light beam angle achieves similar values as in air with NA<1. The immersion medium, i.e. an optically transparent medium with a refractive index greater than one, may optionally be introduced in the beam path before and/or after the field diaphragm 3. On the other hand, the image of the diaphragm edge fills out the sensor surface 6 are as much as possible, so that as many CCD pixels as possible lie in the image. Spatial averaging of the scattered-light signal over many CCD pixels helps to improve the signal-to-noise ratio. The numerical aperture of the micro-objective is selected to be greater than the image-side numerical aperture of the objective 1. If no pupil apodization or other inhomogeneous weighting of beam direction occurs over the pupil of the micro-objective 4, the image picked up by the CCD array 6 of the field stop interior thus constitutes an ideal enlarged image of the aerial image. The field stop 3 can be used to screen off the aerial image from disturbing external scattered light. The micro-objective 4 enlarges the aerial image such that it can be adequately resolved by the CCD array 6.

In a concrete dimensioning example, a pixel spacing of 20 nm with reference to the field stop plane results, that is to say a CCD array 6 with 1024×1024 pixels can detect the whole of a circular field stop 3 with a diameter of 20 µm, virtually 75% of the CCD pixels being situated in the image of the stop interior.

The evaluation part 7 serves the purpose of range-resolved determination of the scattered light caused by the test component with the aid of the scattered-light data picked up by the detection part.

Alternatively, instead of the CCD array 6, it is possible to use any other desired conventional electro-optical sensor system. As a further alternative, it is possible to use as sensor surface a radiation-sensitive layer, in particular a photo-resist layer, which upon irradiation can be changed from a first state to a second state. In the case of such an embodiment, the micro-objective 4 and the field stop 3 can be eliminated, and the radiation-sensitive layer is placed directly in the image plane during examination at a micro-lithographic projection objective, for example in the form of a wafer provided with the photo-resist layer.

Figure 2:
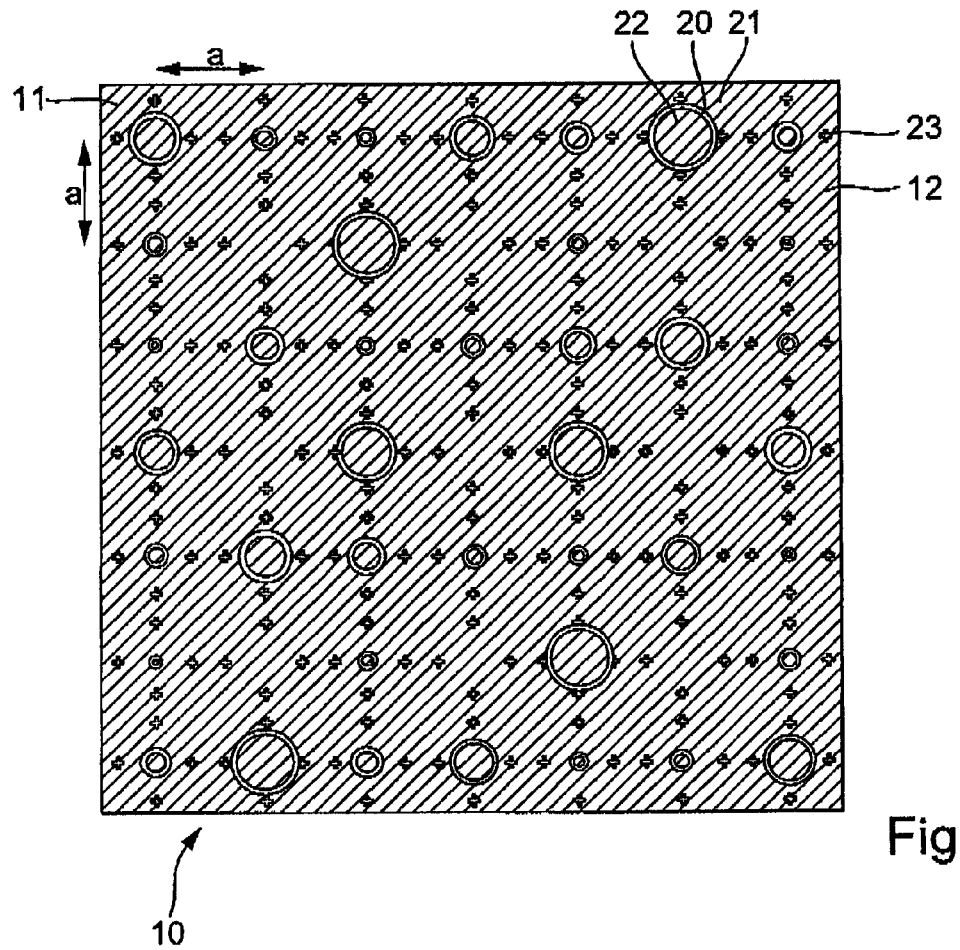
FIG. 2 shows a top view of an illumination mask having a matrix arrangement of scattered-light measuring structures for a device for range-resolved determination of scattered light in accordance with FIG. 1.

FIG. 2 shows a preferred embodiment of the illumination mask 10 for the device for the range-resolved determination of scattered light according to FIG. 1. In this example, the mask 10 has a plurality of scattered-light measuring structures 11, which are arranged in matrix form with a regular distribution, most of them having said scattered-light marker zones 20 while a few of the scattered-light measuring structures are respectively formed by a dark-field surface element 12 which is surrounded only by scattered-light measuring structures 11 with a scattered-light marker zone 20 as its nearest neighbors. In particular, the matrix arrangement comprises 7×7 fields, which respectively include a scattered-light measuring structure 11 with a scattered-light marker zone 20 or a dark-field surface element 12, the edge fields and every other row and every other column of the matrix arrangement being fully occupied by scattered-light marker zones 20. The centres of neighbouring matrix fields have a sufficient spacing a. The illumination mask 10 is designed as a dark-field object, that is to say the surface regions between the scattered-light measuring structures consist of a material which is not transparent to the illuminating light.

Figure 3:
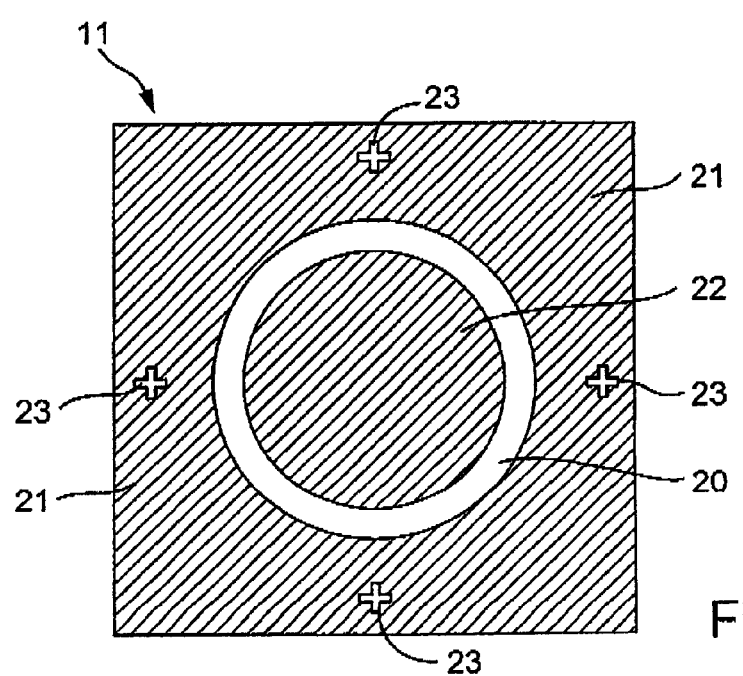
FIG. 3 shows a top view of one of the scattered-light measuring structures of the illumination mask of FIG. 2 having a scattered-light marker zone designed as a ring.

As can be seen more clearly from FIG. 3, each scattered-light marker zone 20 is formed as a ring, i.e. it encloses an inner dark-field zone 22 and is bounded on the outside by an outer dark-field zone 21. Both dark-field zones are illustrated by hatching in FIG. 3. Provided in the outer and inner dark-field zones 21 and 22, respectively, for the purpose of positioning the scattered-light measuring structure 11 are alignment marks 23 which comprise a cruciform bright-field zone which is generally negligibly small by comparison with the scattered-light marker zone 20. Four alignment marks 23 are provided abaxially in the example shown at a 90° spacing and at the same radial distance from the centre. Alternatively, a central alignment mark can be provided in addition. Omission of the central alignment mark avoids any interference based on light passing through said mark.

The scattered-light marker zones 20 of the scattered-light measuring structures 11 on the illumination mask 10 of FIG. 2 have different ring radii, that is to say the inner radius and the outer radius, and thus the radii of the inner dark-field zone 22 and of the outer dark-field zone 21, differ from one scattered-light measuring structure 11 to the other. The ring radii of the various scattered-light marker zones 20 are selected to overlap, for example, that is to say the inner radius of one scattered-light marker zone 20 is larger than the inner radius and smaller than the outer radius of another scattered-light marker zone, and this contributes to improving the signal-to-noise ratio. Alternatively, the ring radii can also be selected not to overlap, for example with outer and inner radii which directly adjoin one another such that the range separation is increased during the determination of scattered light. The selection of scattered-light marker zones 20 which overlap or do not overlap in size, is not, of course, limited to the use of rings, but can be used for any desired scattered-light marker geometries.

Figure 4:
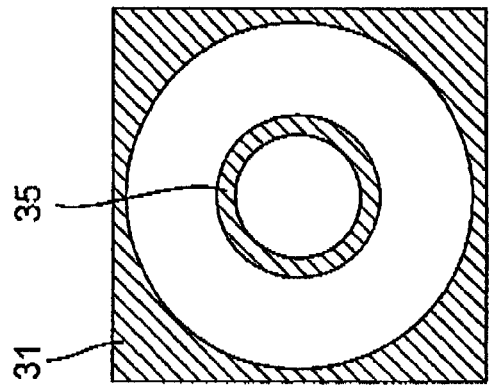
FIG. 4 shows schematic top views of a sensor surface of a CCD array for a detection part of the device of FIG. 1 for the purpose of illustrating a subdivision into subregions for measurement purposes.
Figure 4:
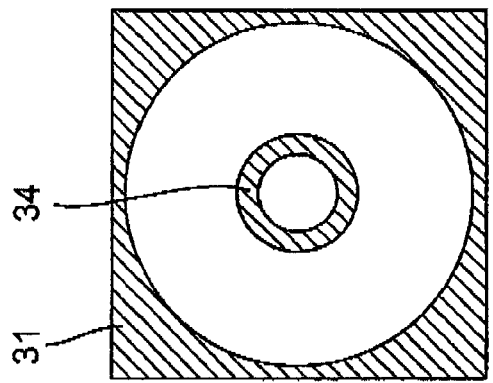
Figure 4:
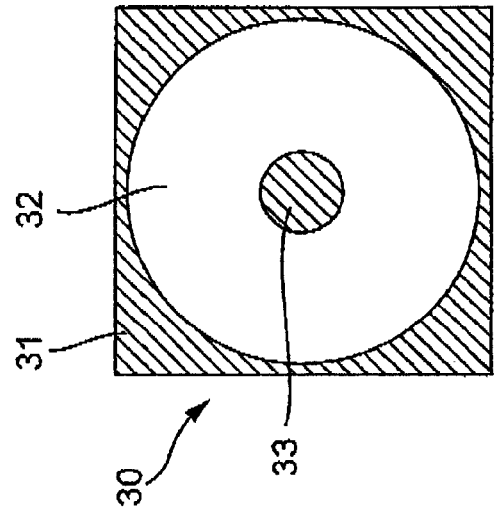

FIG. 4 shows three schematic top views of the CCD array 6 from FIG. 1, more specifically on the pixel field 30 thereof, for the purpose of illustrating a selective subdivision of the CCD pixel field 30 into subregions during measurements of scattered light. The circular image of the field stop opening defines an inner, circular pixel field surface region 32 in which the aerial image imaged by the micro-objective is situated. The part 31, remaining outside thereof, of the square pixel field 30 of the CCD array 6 has no function for the measurement of scattered light. The inner, circular region 32 is subdivided selectively into subregions for the purpose of measurement and evaluation. In a first measuring step, only one central circular region 33 of the pixel field 30 is used for the measurement, as illustrated in the left-hand partial illustration of FIG. 4. In a second measuring step, only one centralized pixel field annular region 34 is actively switched, as illustrated in the middle partial illustration of FIG. 4. In a third measuring step, only one second pixel field annular region 35 is activated, the radius thereof being greater than that of the first annular region 34, as is shown in the right-hand partial illustration of FIG. 4. In the same way, further measuring steps continue with a progressively larger radius of the selectively activated pixel field annular region until the entire active region 32 is covered. In alternative implementations, the consecutive annular regions can be selected with their outer and inner radii overlapping, or not overlapping.

In a measurement cycle with the aid of the device of FIG. 1, all scattered-light marker zones 20 present on the illumination mask 10 are brought in sequence into the beam path and imaged by the projection objective 1 onto the interior of the field stop 3, and from there onto the CCD array 6 via the micro-objective 4. All of the circular inner surface region 32 not shadowed by the field diaphragm is divided by means of appropriate electronic driving of the CCD array 6 into the separately activated subregions according to FIG. 4, which are preferably evaluated simultaneously.

By means of their scattered-light marker zone 20, the scattered-light measuring structures 11 define a minimum and maximum scattering range which differ from one scattered-light measuring structured to another, so that good range resolution can be achieved. A contribution is also made to this effect by the decomposition of the CCD array 6 into the selectively evaluable subregions of the surface region 32 relevant to the measurement. If a number n of scattered-light marking zones 20 are present on the illumination mask, and if the surface region 32 of the CCD array 6 relevant to the measurement is decomposed into a number m of subregions with a different associated scattering distance in each case, a total number n·m of measured values is obtained which can be used to determine the range-resolved scattered light. In this process, the light intensity respectively scattered into a subregion is determined in integral fashion by averaging over the intensity of the scattered light of all the pixels in the subregion.

The dark-field area elements 12 are used to calibrate the measured values, such elements being introduced successively into the beam path, just like the scattered-light measuring structures 11, and so the contribution of the scattered light produced by the dark-field area elements can be measured for the individual subregions of the CCD array and for each pixel thereof. This contribution is subtracted from the contribution which is produced by the respective scattered-light marker zone 20 for the same subregion or the same pixel as, in the case of illumination of the test component with the respective scattered-light marker zone 20, it is not caused by the scattered light which is due to the test component and is actually to be measured. The differential contribution of scattered light is subjected to time normalization by dividing by a prescribable integration exposure time, and divided by a time-normalized bright-field differential contribution in order to generate calibrated scattered-light measured values. The said differential contribution is determined as the difference between a bright-field measurement for the respective CCD subregion and a dark-field measurement with the illumination system switched off, this difference being subjected, in turn, to time normalization by dividing by the selected time of exposure or measurement.

As an alternative to the above-described use of an electro-optical sensor surface, such as the CCD array 6, the invention also comprises the use of photosensitive layers as sensor surface, the layer state of which changes detectably upon exposure to the scattered light to be detected. A photo-resist layer applied to a wafer or another carrier material can, for example, serve as photosensitive layer. The spatial resolution of typical photo-resist layers is so high that the aerial image can be transferred directly to the photo-resist layer even without enlargement, that is to say the photo-resist layer is preferably introduced into the plane of the aerial image produced. In the case of use in the device from FIG. 1, this means that the photo-resist layer is positioned in the image plane of the objective 1 being examined. The field stop 3, the micro-objective 4 and the deflecting mirror 5 can be omitted.

For the purpose of detecting scattered light by means of a photo-resist layer or another suitable photosensitive layer, the respective scattered-light measuring structure 11 of the illumination mask 10 is imaged successively onto different regions of the photo-resist layer with different illumination intensities or illumination doses. For this purpose, the photo-resist layer is displaced suitably laterally from measurement to measurement in a way known per se by a distance which is substantially greater than the dimension, on the side of the aerial image, of the relevant scattered-light measuring structure. The displacement is effected, for example, by means of a conventional wafer holder in which the wafer with the photo-resist layer applied thereto is fixed. For each scattered-light measuring structure, a measurement series is undertaken in which the illumination intensity or illumination dose is increased until the photo-resist layer structure corresponding to the inner dark-field zone 22 has been completely exposed by the influence of scattered light, that is to say has reached the same layer state as the surrounding photo-resist layer annular region, which corresponds to the associated scattered-light marker ring 20. Depending on the type of photo-resist layer, this means, for example, that the photo-resist layer region corresponding to the inner dark-field zone 21 is firstly retained virtually completely in the case of a very low exposure dosage, whereas the surrounding photo-resist layer ring, corresponding to the scattered-light marker ring 20, is developed away, and with a higher exposure dosage the radius of the retained, inner photo-resist layer circle becomes ever smaller until this photo-resist layer circle has entirely vanished at a certain limiting value of the exposure dosage. The radii of the inner photo-resist layer circles retained in a respective measurement series can subsequently be determined in a conventional way, for example in a scanning electron microscope.

In a simple variant of evaluation, for each scattered-light measuring structure use is made as evaluation variable for the range-resolved determination of scattered light only of the exposure dosage limiting value determined in this way at which the photo-resist layer structure corresponding to the inner dark-field zone 21 has firstly entirely vanished. It is sufficient in this case to observe the exposure dosage at which the relevant photo-resist layer structure has completely vanished. In alternative evaluation techniques, the radii of the retained, inner photo-resist layer circles are determined quantitatively as a function of the illumination intensity or illumination dosage, and taken into account additionally or as an alternative to the limiting value of the illumination dosage during the evaluation. The quality of the evaluation and, in particular, the range separation can thereby be substantially improved. Taking into account the measured relationship of the radii of the remaining photo-resist layer structures as a function of the illumination dosage corresponds to the above-described mode of procedure of dividing a pixel field up into a plurality of separately evaluated subregions in the case of the CCD array 6.

The determination of the scattered light distribution function from which it is then possible to deduce the optical quality or the optical properties of the test component and, in particular, the scattering behaviour thereof is performed subsequently in the usual way by solving the appropriate inverse scattering problem. The starting point for this purpose is an approach which describes the calibrated scattered light measured values as the sum of two components, specifically a first, residual long-range component and a second component which includes the scattered-light distribution to be determined. This second component can be described by a double integral of the scattered-light distribution over the relevant object-side and image-side surface regions, in the case of rotationally symmetrical systems, for example, by a first radial integration over the surface of the scattered-light marker zone 20 being considered, and a second radial integration over the surface of the annular or circular subregion being considered on the CCD array, that is to say the integrand is the range-dependent scattered-light distribution function which depends on the lateral differential vector between the scattered position and detector position. The contribution of the second component is, furthermore, divided by the area of the considered subregion of the CCD array, for the purpose of normalization.

In order to solve the inverse scattering problem, an advantageous mode of procedure in the case of rotational symmetry is to use a radially symmetrical step function of variable step height as an approach for the scattered-light distribution function. The unknown step heights, and thus the solution vector of the inverse scattering problem, can then be determined using customary methods for solving inverse scattering problems by means of a least square fit from the calibrated measured values provided with suitable weightings.

Figure 5:
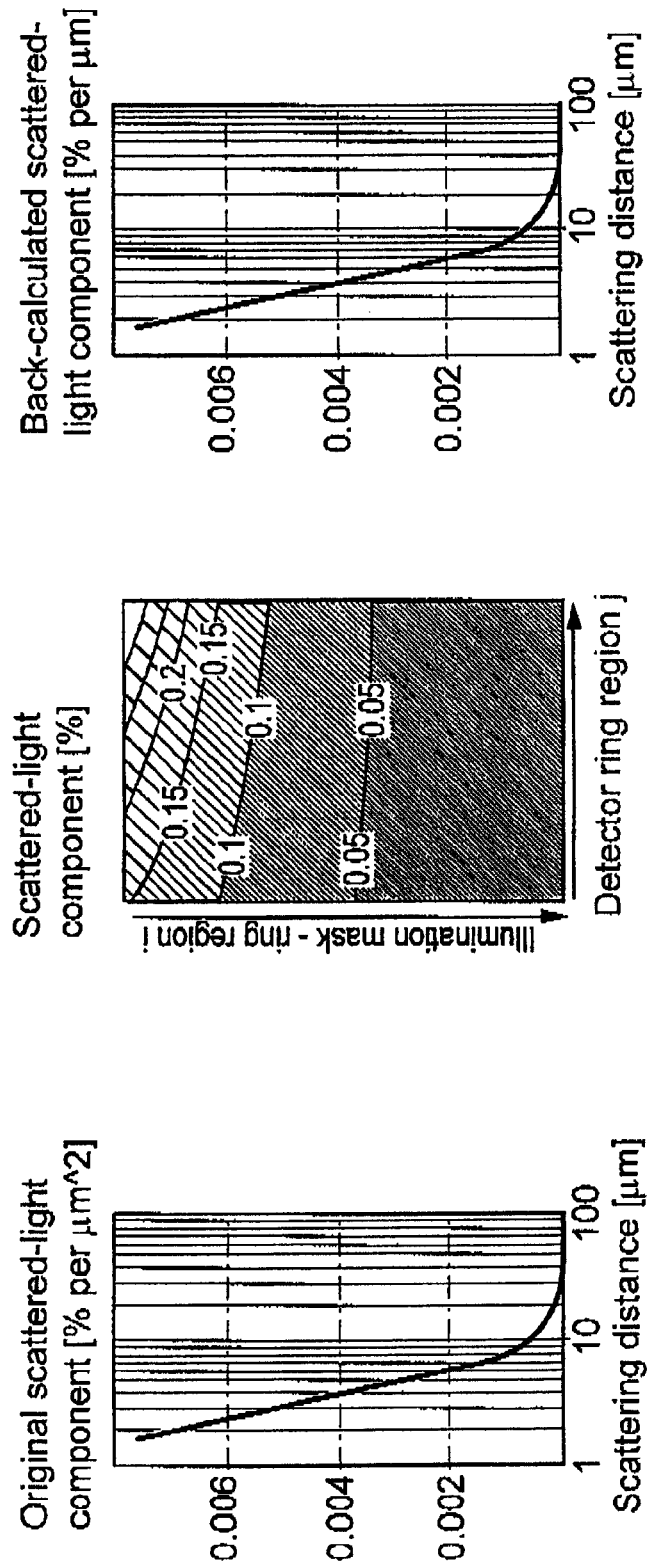
FIG. 5 shows diagrams for the illustration of a simulation result for a range-resolved determination of scattered light, as can be executed using the device of FIG. 1, FIG. 6 a schematic side view corresponding to FIG. 1, but for a variant of the device which is also configured for multi-channel wavefront measurement, FIG. 7 a plan view of a part of an illumination mask which can be used in the device of FIG. 6, FIG. 8 a plan view of a part of an image-field mask which can be used in the device of FIG. 6.

FIG. 5 illustrates in the form of a diagram the result of a practical simulation which proceeds from the device in accordance with FIGS. 1 to 4 and the algorithm, discussed above, for solving the inverse scattering problem, illuminating radiation with a wavelength of 193 nm having been assumed. The left-hand partial illustration shows an assumed distribution of the relative scattered-light component as a function of the scattering distance. The middle partial illustration of FIG. 5 shows the associated scattering data, calculated by integration, as a characteristic diagram for the respective detector-side ring region j and illumination-side ring region i. Assuming a realistic signal-to-noise ratio, these simulated measured values were used to back-calculate the scattered-light distribution by solving the inverse scattering problem using the approach explained above. The associated result, shown in the right-hand partial illustration of FIG. 5, makes it clear that the original scattered-light distribution is reproduced very well, and the approach used is therefore realistic and justified.

Figure 6:
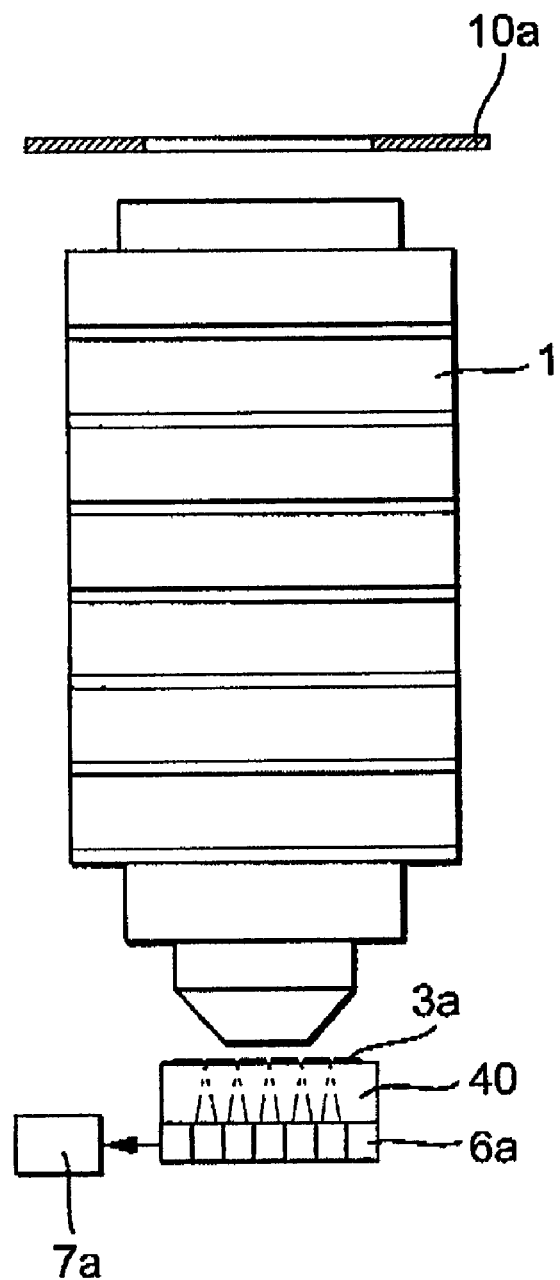

While the measuring of scattered light is carried out in the aforementioned way for a respective field point in the case of the device of FIG. 1, and determination of scattered light is accordingly carried out at a plurality of field points by measurements taken in chronological succession, the device of FIG. 6 permits multi-channel parallelized determination of scattered light simultaneously for all of the relevant field points. Another difference from the device of FIG. 1 is that the device of FIG. 6 is also designed for wavefront measurement of the specimen, for example here again the projection objective 1 of a microlithography projection-exposure system, by multi-channel lateral shear interferometry according to, for example, the aforementioned conventional principle of the multi-channel operational interferometer (OIF). In other words, highly parallelized full-field measuring both of the scattered-light behavior and of the imaging defect behavior of the objective 1 can be carried out by the device of FIG. 6.

The structure of the device of FIG. 6 corresponds to that of FIG. 1 with the following modifications. Positioned on the object side is an illumination mask 10a which is provided over the entire field with an illumination-mask structure, as is shown in the partial plan view of FIG. 7 and will be explained in detail below. On the image side, the device of FIG. 6 contains a detector part which, instead of the field diaphragm 3 of the device of FIG. 1, comprises an image-field mask 3a on a quartz support 40. A CCD array 6a is arranged directly behind the quartz support 40 of the image-field mask 3a, without interposition of imaging optics. The image-field mask 3a has the image-field mask structure as shown in the partial plan view of FIG. 8, which will be explained in be detail below.

Figure 7:
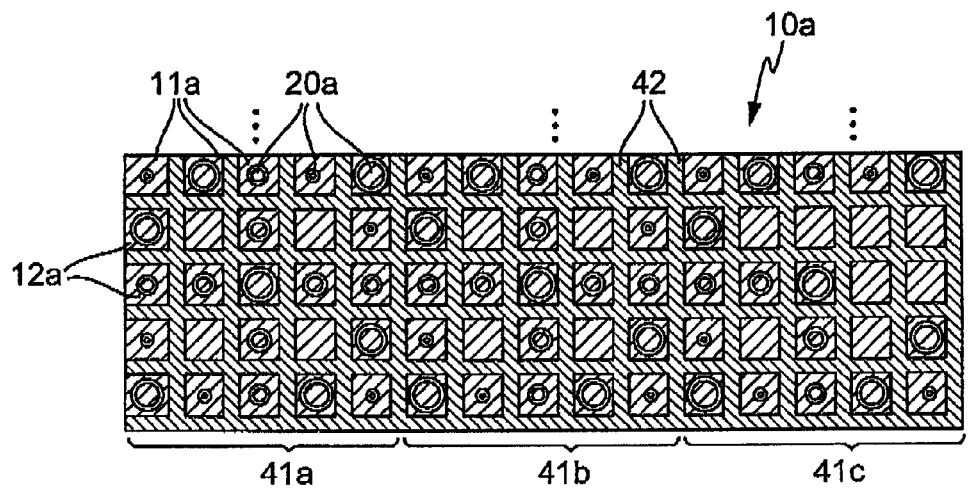

As can be seen in FIG. 7, the illumination mask 10a is composed of a two-dimensional field of illumination-mask unit cells, of which three unit cells 41a, 41b, 41c lying successively in a row direction are depicted in the partial view of FIG. 7. Other such unit cells, symbolically indicated in FIG. 7 by the ellipsis, are arranged successively in a column direction perpendicular to the row direction. Each unit cell consists in turn of a 5×5 matrix of square scattered-light measuring surface elements arranged with a certain spacing, which respectively function as a scattered-light measuring structure 11a with a scattered-light marker zone 20a or a dark-field surface element 12a. There are four of these dark-field surface elements 12a in the example which is shown, one of which is respectively arranged in every other row and every other column of the unit-cell matrix, so that it is surrounded only by scattered-light marker zones 20a as its nearest neighbors. To this extent the illumination mask of FIG. 7 is similar to that of FIG. 2, it being formed similarly as a dark-field object and with the scattered-light marker zones 20a respectively forming annular bright-field zones. That which was said above about the scattered-light marker zones 20 of FIGS. 2 and 3, to which reference may be made, accordingly applies in respect of the properties and alternatives of the annular scattered-light marker zones 20a, apart from the fact that they do not have alignment marks. In particular, the annular scattered-light marker zones 20a have different ring radii, i.e. different radii of the associated inner dark-field zone and the associated outer dark-field zone. The ring radii of the twenty-one different scattered-light marker zones 20a of each unit cell 41a, 41b, 41c are optionally selected to overlap or not overlap. In the latter case, it is possible to increase the range separation for the determination of scattered light.

In addition to this matrix of surface elements 11a for the determination of scattered light, the illumination-mask unit cells 41a, 41b, 41c of FIG. 7 contain a matrix of wavefront-measurement surface elements 42, which are arranged in the intersection areas of the intermediate spaces between the mutually separated scattered-light measuring surface elements 11a, 12a and which respectively contain an illumination-mask structure 42 suitable for a wavefront measurement. In the example which is shown, these wavefront-measurement illumination-mask structures 42 are arranged as five transparent surface squares arranged in a checkerboard pattern around a so-called coherence mask structure. As is known, such a coherence mask structure is suitable as a wavefront-generating structure for a wavefront measurement by lateral shear interferometry, a multi-channel full-field measurement of the specimen 1 can be carried out by using the arrangement of these coherence mask structures 42 in matrix form over the entire illumination mask. In other words, the illumination mask of FIG. 7 may be used to carry out both a range-resolved determination of scattered light and measuring of multi-channel lateral shear interferometry on the specimen 1 by the multi-channel full-field measurement technique.

Conventional types of diaphragms which are used in a conventional upstream illumination system (not shown) expediently insure that only the scattered-light measuring surface elements 11a of the illumination mask 10a are exposed in the scattered-light measuring mode, while the coherence mask structures 42 remain shadowed, and conversely insure that only the coherence mask structures 42 are illuminated in wavefront-measurement operation and the scattered-light measuring surface elements 11a remain shadowed. This avoids scattered-light effects on the structures intended for one type of measuring operation in the other type of measuring operation.

Figure 8:
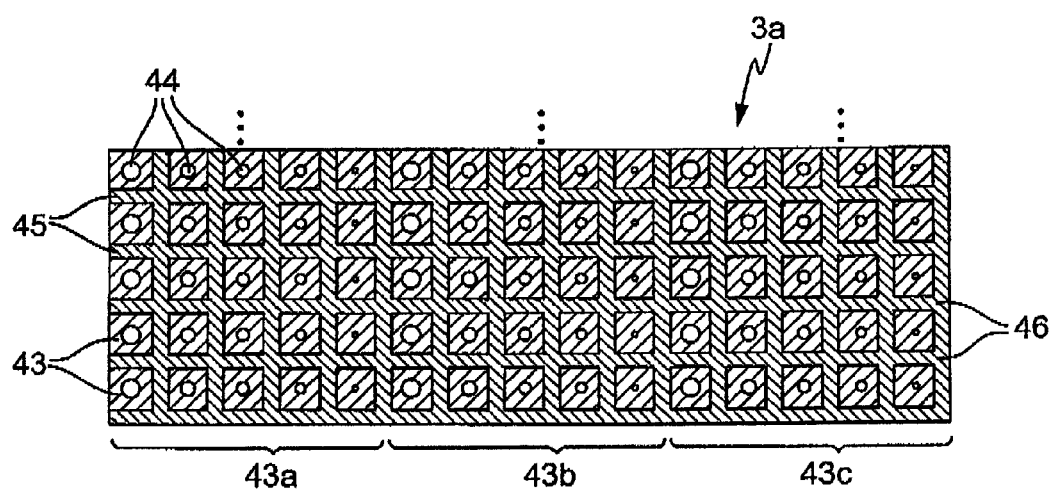

The image-field mask of FIG. 8 is correspondingly suitable for measuring multi-channel shear interferometry. Correspondingly to the illumination-mask unit cells 41a, 41b, 41c, the image-field mask of FIG. 8 is formed by a 1×5 field of unit cells 43a, 43b, 43c, which respectively contain five scattered-light measuring surface elements 44 arranged mutually separated in a row direction and five wavefront-measurement surface elements 45. In particular, three such unit cells 43a, 43b, 43c are arranged successively in the row direction in FIG. 8 to form an image-field mask row, and a predeterminable number of such image-field mask rows follow one another in a column direction, as indicated by the ellipsis in FIG. 8. In this way, the wavefront-measurement surface elements 45 are respectively arranged in the intersection area between the scattered-light measuring surface elements 44.

The scattered-light measuring surface elements 44 of the image-field mask 3a respectively form a diaphragm opening structure with a transparent, circular diaphragm opening, while the remaining part of these square scattered-light measuring surface elements 44 is not transparent. In particular, diaphragm openings with different opening diameters are selected for the five successive scattered-light measuring surface elements 44 in the row direction of each image-field mask unit cell 43a, 43b, 43c. In the example which is shown in FIG. 8, the opening diameter then decreases for the five diaphragm opening structures 44 sequenced from left to right.

The wavefront-measurement surface elements 45 of the image-field mask 3a respectively form a diffraction-grating structure. The illumination mask 3a therefore contains, interleaved over the entire field of view, a matrix of diaphragm structures 44 for the range-resolved measuring of scattered light and a matrix of diffraction structures 45 for the wavefront measurement by lateral shear interferometry. Any diffraction structures known for this application may be used for the diffraction structure 45, a checkerboard grating structure being selected in FIG. 8 by way of an example.

As can be seen from the preceding description of the illumination mask 10a and the image-field mask 3a, the device of FIG. 6 can be operated selectively in a highly parallelized scattered-light measuring mode and in a highly parallelized wavefront measuring mode. To that end, the illumination mask 10a and the image-field mask 3a are respectively positioned on the object side, preferably in or close to an object plane of the objective 1, and on the image side, preferably in or close to an image plane of the objective 1, in corresponding positions according to the plan views of FIGS. 7 and 8, i.e. the diaphragm structures 44 respectively lie in the vicinity of the air image of a scattered-light measuring structure 11a and the diffraction structures 45 lie in the region of influence of the wavefront radiation coming from an associated coherence mask structure 12a. Determination of scattered light or a wavefront measurement can thus simultaneously be carried out selectively for all of the relevant field points.

In the device of FIG. 6, the CCD array 6a is primary used as a light collector for all of the radiation passing through the image-field mask 3a. The spacings of neighboring diffraction structures 45 of the image-field mask 3a are selected to be large enough so that the associated beams of rays do not overlap on the detector surface of the CCD array 6a, taking into account the opening angle which may be relatively large when a projection objective 1 with a very high numerical aperture is being studied. The range separation in the scattered-light measuring mode is facilitated in the device of FIG. 6 by using the diaphragm structures 44 with different diaphragm opening diameters on the image-field mask 3a, instead of selecting different, actively configured CCD pixel field ring regions, as in the device of FIG. 1, see the preceding description of FIG. 4.

As in the device of FIG. 1, it is also possible to use an immersion medium in the detection part of the device of FIG. 6, if so required. In particular, there may be an immersion medium in the optical path before the image-field mask 3a, i.e. between the objective 1a to be measured and the image-field mask 3a, and/or between the quartz support 40 and the CCD array 6a. In the latter case, the immersion medium fills the gap necessarily left between the quartz support and the CCD array 6a in order to compensate for irregularities. All media conventionally used for this may be employed as an immersion medium, for example water.

The alignment of the illumination mask 10a relative to the image-field mask 3a is carried out in two stages. In a first step, direct alignment is carried out by displacing the illumination mask 10a stepwise relative to the image-field mask 3a and recording the associated measuring signal from the CCD array 6a. Whenever air images of scattered-light marker zones 20a with a relatively small internal diameter are encountered in the vicinity of the diaphragm openings 44 with a large external diameter, the measuring signal will increase significantly as soon as direct radiation passes through the diaphragm opening 44, even if the misalignment is small. In a possible embodiment, the illumination mask 10a comprises a matrix of 3×3 unit cells 41a, 41b, 41c, . . . and therefore respectively a matrix of 15×15 scattered-light measuring surface elements 11a and 15×15 wavefront-measurement surface elements 42. An optimum relative lateral position is then obtained for each unit cell 41a, 41b, 41c, . . . , that is to say a 3×3 array of optimum lateral positions for all of the unit cells 41a, 41b, 41c. This allows complete elimination both of translation defects and of relative scaling and rotation defects. A coarse adjustment of the focus may be carried out at this stage, for example by visual focusing which uses a Moiré fringe technique, to which end conventional types of grating patterns (not shown) are provided in an associated edge region of the illumination mask 10a and of the image-field mask 3a. In a second step, the fine adjustment is carried out with respect to distortion and astigmatism defects by using the actual wavefront-measurement data.

The measuring process with the device of FIG. 6 will now be explained by way of an example for a matrix of 11×11 field points. The aforementioned illumination mask 10a, respectively with a 15×15 matrix of scattered-light measuring surface elements 11a and wavefront-measurement surface elements 42 is suitable for this. Eleven scattered-light measuring rows 43 and wavefront-measurement rows 46, with fifteen columns each, are then respectively sufficient for the image-field mask 3a.

In the scattered-light measuring mode, the measuring signals of the CCD array 6a are recorded for a corresponding central 11×11 matrix of associated pairs of scattered-light measuring structures 11a of the illumination mask 10a, on the one hand, and diaphragm opening structures 44 of the image-field mask 3a, on the other hand. In this case, neighboring field points firstly use the air images of different scattered-light measuring surface elements 11a of the illumination mask 10a and different diaphragm-structure surface elements 44 of the image-field mask 3a. In order to illuminate a respective field point with each of the total twenty-five different scattered-light measuring surface elements 11a, 12a of an illumination-mask unit cell 41a, 41b, 41c, the illumination mask 10a is moved sequentially through all of the twenty-five lateral positions needed for this. The edge overlap of the illumination mask 10a, which has a size of 15×15 surface elements, of respectively two surface regions on each of the four sides is used for this. The five different aperture sizes are sequentially applied for each field point by moving the image-field mask 3a horizontally through integer multiples of the spacing of the diaphragm structures 44. The edge overlap on the two sides of the image-field mask 3a lying opposite each other in the translational direction is in turn used for this, which again amounts to two columns, since the image-field mask 3a has fifteen columns.

A set of 25·5 measuring values, which result from the twenty-five illumination-mask settings combined with the five image-field mask settings and are to be taken sequentially, is obtained for each of the 11×11 field points by combining the two measuring steps above. The performance capacity of the device of FIG. 6, based on the twenty-one different sizes of scattered-light marker zones 20a and the five different sizes of diaphragm openings 44, corresponds to the performance capacity of the device of FIG. 1. In the device of FIG. 6, the evaluation of the measurement signals is carried out with an evaluation part 7a by the same evaluation technique as described above with reference to the example of FIG. 1, with the evaluation part 7 there, to which reference may be made.

Compared with the device of FIG. 1, the device of FIG. 6 has the advantage of a significantly shorter total measuring time. Under typical conditions of, for example, about 12 s for an individual measurement including the waiting time, the device of FIG. 6 requires only about 25 minutes overall for the total 125 measuring processes and then provides the full-field information for the range-resolved measuring of scattered light. Under the same conditions with the non-parallelized measuring technique of the device of FIG. 1, a measurement time or several hours would be needed in order to obtain the same full-field information.

The device of FIG. 6 also makes it possible to obtain the full-field information for the imaging defect behavior of the specimen 1 by a parallelized wavefront measurement by means of multi-channel lateral shear interferometry. This then characterizes the objective 1 completely, apart from any very long-range scattered-light effects. With the device of FIG. 6, for example, projection objectives of microlithography projection-exposure systems of the scanner or stepper type can be characterized for all field points, in respect of scattered-light behavior and imaging defect behavior, with a comparatively short measuring time. The signal strength and therefore the signal-to-noise ratio, or the necessary integration time of a CCD camera being used is likewise less for the device of FIG. 6 compared with the sequential measuring technique of the device of FIG. 1, i.e. the resulting signal attenuation is reduced. With a comparable CCD sensitivity, this allows a significant reduction of the CCD integration time. Since the device of FIG. 6 does not have any imaging optics in the detector part, it is also free of any perturbing effects of such imaging optics, for example generation of scattered light. Similar properties and advantages as for the device of FIG. 1, as explained above with reference thereto, are moreover obtained with the device of FIG. 6. It should be understood that the invention also covers variants of the device of FIG. 6 which use another conventional wavefront measurement technique, instead of lateral shear interferometry, to which end the wavefront measurement structures on the illumination mask and the image-field mask are then respectively selected accordingly.

Figure 9:
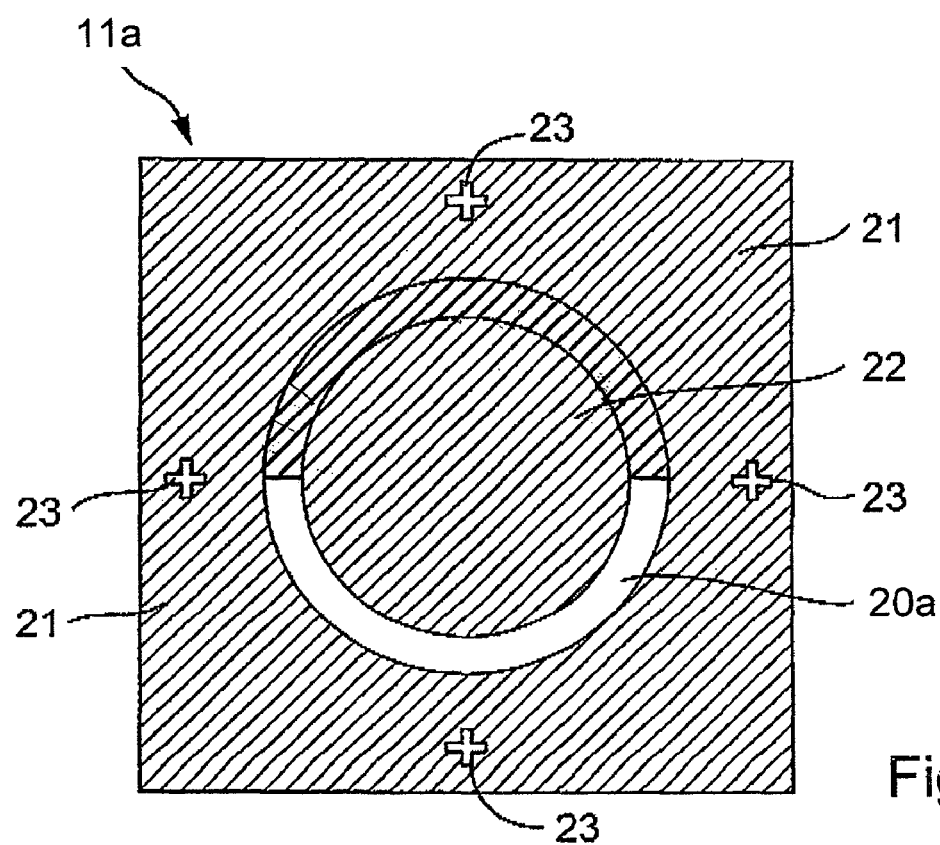
FIG. 9 shows a top view of one example of a rotationally non-symmetrical scattered-light marker zone.

The device according to the invention can be used not only for range-resolved determination of scattered light at projection objectives of micro-lithographic projection exposure apparatuses, but also at any other desired optical systems. Again, it is possible, as an alternative to the closed annular shape shown e.g. in FIG. 3, to use scattered-light marker zones of another, in particular also not rotationally symmetrical shape, adapted to the geometry of the optical systems to be examined or of the symmetry of their scattering behaviour, for example the shapes of an annular segment. Such a scattered-light marker zone is illustrated by way of example in FIG. 9, where reference 11a designates the scattered-light measuring structure, reference 20a designates the annular segment, and all other reference numerals correspond to the reference numerals described with respect to FIG. 3.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

The invention claimed is:

1. An illumination mask for a device for determination of scattered light scattered from illuminating radiation defining a beam path, the illumination mask comprising:
   a scattered light measurement structure,
   wherein the scattered light measurement structure has a scattered light marker zone transparent to the illuminating radiation, and
   wherein the scattered light marker zone has a rotationally non-symmetric, annular segment shape bounded by a dark field zone that is non-transparent to the illuminating radiation.

2. The illumination mask of claim 1, wherein the scattered light measurement structure further comprises a surface element consisting essentially of a dark field zone.

3. The illumination mask of claim 1, wherein the dark field zone located in a central portion of the scattered light measurement structure.

4. The illumination mask of claim 1, wherein the illumination mask creates an illumination pattern when illuminated with extreme ultraviolet light.

5. The illumination mask of claim 1, wherein a plurality of scattered light measurement structures are arranged in a regular array on the illumination mask.

6. The illumination mask of claim 1, wherein the determination of scattered light is a range-resolved determination of scattered light.

7. A scattered light measurement device, comprising:
   an illumination mask providing measuring radiation on an entrance side of a test component consisting at least essentially of a projection objective, and
   a detection part for detection of the measuring radiation scattered by the test component and disposed on an exit side of the test component,
   wherein the illumination mask comprises at least one scattered light measurement structure,
   wherein the scattered light measurement structure has a scattered light marker zone transparent to illuminating radiation including the measuring radiation; and
   wherein the scattered light marker zone has a rotationally non-symmetric, annular segment shape bounded by a dark field zone that is non-transparent to the illuminating radiation.

8. The scattered light measurement device of claim 7, wherein the detection of light is a range-resolved detection of scattered light.

9. The scattered light measurement device of claim 7, wherein the scattered light measurement structure further comprises a surface element that consists essentially of a dark field zone.

10. The scattered light measurement device of claim 7, wherein the dark field zone is located in a central portion of the scattered light measurement structure.

11. The scattered light measurement device of claim 7, wherein a plurality of scattered light measurement structures are arranged in a regular array on the illumination mask.

12. A method of using the scattered light measurement device of claim 11, wherein the test component is irradiated sequentially with the measuring radiation passing through the plurality of scattered light measurement structures, and the detection part detects the scattered measuring radiation sequentially as the test component is irradiated with the measuring radiation passing through each scattered light measurement structure.

13. The scattered light measurement device of claim 7, wherein the illumination mask creates an illumination pattern when illuminated with extreme ultraviolet light.

14. A method of detecting scattered light, the method comprising:
   disposing a mask comprising a scattered light measurement structure with a scattered light marker zone transparent to illuminating radiation and having a rotationally non-symmetric, annular segment shape bounded by a dark field zone that is non-transparent to the illuminating radiation;
   illuminating the mask with the illuminating radiation;
   disposing a detection apparatus for detecting the illuminating radiation scattered by a projection objective;
   disposing the projection objective optically between the mask and the detection apparatus; and
   detecting the illuminating radiation scattered by the projection objective with the detection apparatus.

15. The method of claim 14, wherein the mask is illuminated with extreme ultraviolet light.

16. The method of claim 14, wherein the dark field zone is located in a central portion of the scattered light measurement structure.

17. The method of claim 14, wherein the mask comprises a plurality of scattered light measurement structures arranged on the mask, and
   wherein the scattered light measurement structures are used sequentially to measure scattered light behavior.

18. A micro-lithographic projection exposure apparatus comprising:
   a projection objective; and
   a scattered light measurement device for performing scattered light measurement of the projection objective,
   wherein the scattered light measurement device comprises:
      an illumination mask comprising at least one scattered light measurement structure wherein the scattered light measurement structure comprises a scattered light marker zone transparent to light; and
      a detection apparatus for detecting the light scattered by and emitted from the projection objective, wherein the scattered light marker zone has a rotationally non-symmetric, annular segment shape bounded by a dark field zone that is non-transparent to the light.

19. The apparatus of claim 18, wherein the dark field zone covers a central portion of the scattered light measuring structure.

20. The apparatus of claim 18, further comprising an illumination source that provides the light, which comprises extreme ultraviolet light.

21. The apparatus of claim 18, wherein a plurality of the scattered light measurement structures are arranged in a regular array on the illumination mask.

22. A method for operating a device for determining scattered light from a projection objective, the device comprising:
- an illumination mask, comprising at least one scattered light measurement structure having a scattered light marker zone, which is transparent to radiation, with a rotationally non-symmetric, annular segment shape bounded by a dark field zone that is non-transparent to the radiation, for providing measuring radiation on an entrance side of the projection objective, and
- a detection part for detecting the radiation scattered by the projection objective and exiting on an exit side of the projection objective, wherein the method comprises:
- irradiating the projection objective with the measuring radiation;
- detecting the exiting radiation; and
- determining the scattered light from the detected radiation.

23. The method of claim 22, wherein the dark field zone located in a central portion of the scattered light measurement structure.

24. The method of claim 22, wherein the scattered light determination is a range-resolved determination of the scattered light.

25. The method of claim 22, wherein the radiation comprises extreme ultraviolet light.

26. A method of detecting scattered light in an optical system, the method comprising:
- using scattered light marker zones to detect the scattered light;
- wherein the scattered light marker zones are transparent to illuminating radiation and have rotationally non-symmetric shapes forming annular segments and are bounded by respective dark field zones that are non-transparent to the illuminating radiation; and
- wherein the scattered light is detected in the annular segments.

* * * * *